US008641817B2

(12) United States Patent
Cortina Blanco et al.

(10) Patent No.: US 8,641,817 B2
(45) Date of Patent: Feb. 4, 2014

(54) PAINT WITH METALLIC MICROWIRES, PROCESS FOR INTEGRATING METALLIC MICROWIRES IN PAINT AND PROCESS FOR APPLYING SAID PAINT ON METALLIC SURFACES

(75) Inventors: Daniel Cortina Blanco, Madrid (ES); Pilar Marin Palacios, Madrid (ES); Antonio Hernando Grande, Madrid (ES); Ainhoa Gonzalez Gorriti, Madrid (ES)

(73) Assignee: Micromag 2000, S.L., Madrid (ES)

( * ) Notice: Subject to any disclaimer, the term of this patent is extended or adjusted under 35 U.S.C. 154(b) by 274 days.

(21) Appl. No.: 13/081,904

(22) Filed: Apr. 7, 2011

(65) Prior Publication Data

US 2012/0258245 A1    Oct. 11, 2012

(51) Int. Cl.
*C09D 5/32* (2006.01)
*C09D 5/33* (2006.01)
*C09C 1/62* (2006.01)

(52) U.S. Cl.
USPC ........ 106/403; 252/62.55; 252/184; 252/478; 252/500; 252/512; 252/600; 342/1; 342/4

(58) Field of Classification Search
USPC ............... 106/403; 252/62.55, 184, 478, 500, 252/512, 600; 342/1, 4
See application file for complete search history.

(56) References Cited

U.S. PATENT DOCUMENTS

| | | | | |
|---|---|---|---|---|
| 4,155,896 | A * | 5/1979 | Rennier et al. | 523/200 |
| 4,606,848 | A * | 8/1986 | Bond | 252/511 |
| 5,085,931 | A | 2/1992 | Boyer, III et al. | |
| 5,147,718 | A | 9/1992 | Papoulias et al. | |
| 6,270,591 | B2 * | 8/2001 | Chiriac et al. | 148/300 |
| 6,399,737 | B1 * | 6/2002 | Elkovitch | 528/196 |
| 7,425,604 | B2 * | 9/2008 | Cosman et al. | 528/373 |
| 2002/0046849 | A1 | 4/2002 | Rapp et al. | |
| 2007/0141332 | A1 * | 6/2007 | Adar | 428/364 |
| 2009/0075068 | A1 | 3/2009 | Pyo et al. | |
| 2011/0192643 | A1 * | 8/2011 | Marin Palacios et al. | 174/377 |

FOREIGN PATENT DOCUMENTS

| | | |
|---|---|---|
| EP | 1 675 217 | 6/2006 |
| EP | 2325945 A1 * | 5/2011 |
| FR | 2748810 A1 * | 11/1997 |
| GB | 2 450 593 | 12/2008 |
| JP | 05145265 A * | 6/1993 |
| WO | 93/22774 | 11/1993 |
| WO | 03/004202 | 1/2003 |
| WO | WO 2010/029193 A1 * | 3/2010 |

OTHER PUBLICATIONS

Derwent—Acc—No. 2007-393599, abstract of Korean Patent Specification No. KR 2006039277 A (May 2006).*
European Search Report dated Jul. 28, 2011, from corresponding European Application No. 11 38 2066.
I. W. Donald, et al. "The preparation, properties and applications of some glass-coated metal filaments prepared by the Taylor-wire process" Journal of Materials Science 31 (1996) 1139-1149.
European Communication pursuant to Article 94(3) EPC dated Nov. 5, 2012, from corresponding European Application No. 11 382 066. 6-2102.

* cited by examiner

*Primary Examiner* — Anthony J Green
(74) *Attorney, Agent, or Firm* — Katten Muchin Rosenman LLP

(57) ABSTRACT

The present invention relates to a paint with metallic microwires, to the process for integrating metallic microwires to obtain such paint, and to a process for applying said paint on metallic surfaces (1).
The process for applying paint is performed in several steps:
applying a first coat (2) of primer on the metallic surface;
applying on the first coat (2) a second coat (3, 3') of paint;
applying on said second coat (3) an active third coat (4) of a paint containing microwires; and
sanding said active third coat (4) with fine grain sandpaper to remove the microwires oriented perpendicular to the plane of the metallic surface;
the maximum attenuation frequency of the reflectivity of said electromagnetic radiation being determined within of the range of maximum attenuation frequencies given by the composition of the paint with microwires, and by the thicknesses and dielectric constants of the different coats.

5 Claims, 2 Drawing Sheets

PAINT WITH METALLIC MICROWIRES, PROCESS FOR INTEGRATING METALLIC MICROWIRES IN PAINT AND PROCESS FOR APPLYING SAID PAINT ON METALLIC SURFACES

FIELD OF THE INVENTION

The invention is comprised in the technical field of metamaterials or composites, also covering aspects of electromagnetism, magnetic absorbers and metallurgy.

BACKGROUND OF THE INVENTION

Multiple applications which require eliminating reflections of electromagnetic radiation are known.

Thus, for example, microwave absorbers are made by modifying dielectric properties, in other words, the dielectric permittivity or the magnetic permeability of determined materials. To that end, it is necessary to disperse small sized metallic elements in a dielectric matrix. Various inventions show these types of solutions, as is the case of U.S. Pat. No. 5,147,718, in which a radar absorber based on the dispersion of carbonyl iron powder into a paint is described. The solution is also shown in patent document WO 03/004202 which shows a method for making an electromagnetic radiation absorber based on the dispersion of flakes of an iron-silicon alloy. The solution is also shown in U.S. Pat. No. 5,085,931 in which an electromagnetic radiation absorber is formed by dispersing acicular magnetic filaments into a dielectric matrix.

Some absorbers based on amorphous magnetic microwires obtained by the Taylor technique ("*The preparation, properties and applications of some glass coated metal filaments prepared by the Taylor-wire process*", W. Donald et al., Journal of Material Science, 31, 1996, pp. 1139-1148) can be included among magnetic type absorbers. This type of absorber can be a dielectric matrix in which amorphous magnetic microwires with high magnetic anisotropy having magnetic resonance properties are randomly distributed, as described in European patent EP-1675217.

DESCRIPTION OF THE INVENTION

The invention relates to a paint with metallic microwires wherein:

A paint with metallic microwires for attenuating the reflectivity of electromagnetic radiation, the paint having a determined dielectric constant $\in_r$, characterised in that the paint comprises:
  a proportion X of amorphous metallic microwires having a length l and a metallic core of diameter $d_c$;
  a solvent corresponding to said paint in an amount less than 20%;
  and in that the maximum attenuation frequency of the reflectivity of said electromagnetic radiation has a range which is determined by the length l and the diameter $d_c$ of the metallic core of the microwires, by the proportion of microwires in the paint, and by the dielectric constant of the paint without microwires.

The invention also related to a process for integrating metallic microwires in paint wherein:

A process for integrating metallic microwires in a paint for attenuating the reflectivity of electromagnetic radiation, the paint having a determined dielectric constant $\in_r$ which comprises:
  liquefying the paint with a solvent corresponding to said paint in an amount less than 20%;
  adding amorphous metallic microwires in a specific proportion to said liquefied paint, the microwires having a length l and a metallic core of diameter $d_c$;
  beating the mixture of paint with microwires at a maximum speed depending on the length of the microwires;
  the maximum attenuation frequency of the reflectivity of said electromagnetic radiation having a range which is determined by the length l and the diameter $d_c$ of the metallic core of the microwires, by the proportion of microwires in the paint, and by the dielectric constant of the paint without microwires.

The invention also relates to a process for applying said paint on metallic surfaces wherein:

A process for applying paint on a metallic surface (1), which comprises:
  applying a first coat (2) of primer on the metallic surface, said first coat having a first dielectric constant $\in_{r1}$ and a first thickness d1;
  applying on the first coat (2) a second coat (3, 3') of paint, said second coat having a second dielectric constant $\in_{r2}$ and a second thickness d2;
  applying on said second coat (3) an active third coat (4) of a paint containing microwires defined as above, said third coat having a third dielectric constant $\in_{r3}$ and a third thickness d3; and
  sanding said third active coat (4) with fine grain sandpaper to remove the microwires orientated perpendicular to the plane of the metallic surface;
  the maximum attenuation frequency of the reflectivity of said electromagnetic radiation being determined within the range of maximum attenuation frequencies given by the paint with microwires, by the first, second and third thicknesses d1, d2, d3 and by the first, second and third dielectric constant $\in_{r1}$, $\in_{r2}$, $\in_{r3}$ of the different coats.

A first aspect of the invention relates to a paint with metallic microwires for attenuating the reflectivity of electromagnetic radiation, the paint having a determined dielectric constant $\in_r$; the paint comprises:
  a proportion X of amorphous metallic microwires having a length l and a metallic core of diameter $d_c$;
  a solvent corresponding to said paint in an amount less than 20%; the maximum attenuation frequency of the reflectivity of said electromagnetic radiation having a range which is determined by the length l and the diameter $d_c$ of the metallic core of the microwires, by the proportion of microwires in the paint, and by the dielectric constant of the paint without microwires.

A second aspect of the present invention relates to a process for integrating metallic microwires in paint for attenuating the reflectivity of electromagnetic radiation, the paint having a determined dielectric constant $\in_r$; the process comprises:
  liquefying the paint with a solvent corresponding to said paint;
  adding amorphous metallic microwires in a proportion X to said liquefied paint, the microwires having a length l and a metallic core of diameter $d_c$;
  beating the mixture of paint with microwires at a maximum speed depending on the length of the microwires;
the range of maximum attenuation frequencies of the reflectivity of said electromagnetic radiation being determined by the length l and the diameter $d_c$ of the metallic core of the microwires, by the proportion X of microwires in the paint, and by the dielectric constant of the paint without microwires.

The amount of solvent used for liquefying the paint must not be greater than 20%.

The metallic microwire used in the present invention is preferably a metallic filament of high electrical conductivity or of an amorphous magnetic alloy with Pyrex coating, in which the diameter of the core and the total diameter are not greater than 100 and 200 µm, and with a length comprised between 0.1 and 20 mm.

The beating for integrating the microwire in the paint is preferably performed with a mixing rod at a maximum speed of 2500 r.p.m.

Another aspect of the invention relates to the application of said paint with microwires on a metallic surface for the attenuation of the reflectivity of electromagnetic radiation which comprises:

applying a first coat of primer on the metallic surface, said first coat having a first dielectric constant $\in_{r1}$ and a first thickness d1;

applying on the first coat a second coat of paint, said second coat having a second dielectric constant $\in_{r2}$ and a second thickness d2 applying on said second coat an active third coat of a paint containing microwires as defined above, i.e., a paint with metallic microwires with a known composition and which provides a range of maximum attenuation frequencies of reflectivity of electromagnetic radiation, said third coat having a third dielectric constant $\in_{r3}$ and a third thickness d3; and sanding said active third coat with fine grain sandpaper to remove the microwires orientated perpendicular to the plane of the metallic surface, the maximum attenuation frequency of the reflectivity of said electromagnetic radiation being determined within the range of maximum attenuation frequencies given by the paint with microwires, by the first, second and third thicknesses d1, d2, d3 and by the first, second and third dielectric constants $\in_{r1}$, $\in_{r2}$, $\in_{r3}$ of the different coats.

The process preferably includes an additional step of:

applying a fourth coat of finish paint, said fourth coat having a fourth dielectric constant $\in_{r4}$ and a fourth thickness d4.

The metallic surface can be a composite with high conductivity, or it can also be a plastic metalized, for example, by means of metallic adhesive tapes or with metallic paint.

The paint can be applied by means of a spray gun, roller or airless system.

Preferably, the microwires used in the spray or airless gun application method do not have lengths greater than 5 mm.

Preferably, the microwires used in the roller application method do not have lengths greater than 20 mm.

The following must be considered with regard to the application steps:

The first coat of primer has a dielectric constant, $\in_{r1}$ with a real part preferably comprised between 2 and 4, it is applied on the metallic surface and its thickness can be comprised between 20 and 100 µm.

The second coat of paint can have a thickness between 25 µm and 5000 µm with a real part of the dielectric constant $\in_{r2}$ between 2 and 9 and it is applied on the first coat of primer.

This second coat of paint can contain metallic microwires; in this case, its dielectric constant $\in_{r2}$ can range between 2 and 500.

The values of the real part of the dielectric constant of the second coat $\in_{r2}$ can be modified by varying the percentage by weight of the microwire between 0.5 and 5%.

The active third coat can have a thickness between 75 and 500 µm, and the real part of its dielectric constant $\in_{r3}$ can be between 9 and 1000, and it is modified based on a percentage by weight of the microwire comprised between 0.5 and 10% by weight.

The fourth coat of finish paint can have a thickness between 25 and 100 µm, and the real part of its dielectric constant $\in_{r4}$ can be comprised between 2 and 9.

Preferably, the fourth coat of finish paint does not contain a high density of metallic or carbon particles; otherwise it can reflect electromagnetic radiation.

The thickness of the second coat, which is the coat that mainly determines at what distance the active third coat with the microwires of the metallic surface is located, greatly influences the tuning frequency for the attenuation of electromagnetic radiations.

The tuning frequency can range between 0.1 and 70 GHz for a sum of thicknesses of the second and third coats between 25 and 5000 µm.

BRIEF DESCRIPTION OF THE DRAWINGS

To complement the description which is being made and for the object of aiding to better understand the features of the invention according to a preferred practical embodiment thereof, a set of drawings is attached as an integral part of said description in which the following has been depicted with an illustrative and non-limiting character.

PREFERRED EMBODIMENT OF THE INVENTION

Figure 1:
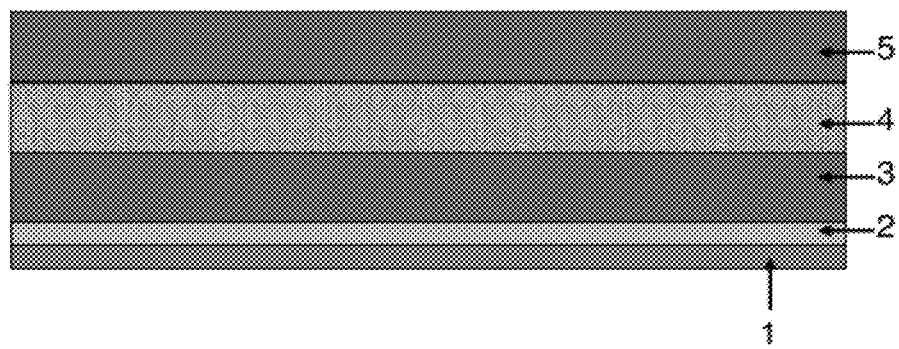
FIGS. 1 and 2 show a sectional view of respective metallic surfaces painted according to the process of the invention, with a variation in the second coat.

A preferred embodiment of the process for integrating metallic microwires in paint is described below. This process includes:

liquefying the paint with a solvent which is suitable for said paint in an amount no greater than 20%;

adding to the previously dissolved paint a determined amount of microwires with determined length l and diameter of the metallic core $d_c$;

beating the mixture using a mixing rod at low speed (preferably at a speed no greater than 2500 rpm) so as not to break the microwires.

The process object of the invention has been confirmed as effective for painting on a metallic surface in two cases: both with amorphous microwires with the same composition, $Fe_{89}Si_3B_1C_3Mn_4$ and varying the geometry thereof.

In the first case amorphous microwires with a diameter of the metallic core of 20 µm and a length of 3 mm were used. The microwires were integrated in the paint by beating with a mixing rod at 1700 rpm, the paint having a real part of the dielectric constant, $\in_r$, of value 4 lowered with 5% solvent.

A first coat 2 of primer of 30 µm and with a real part of the dielectric constant $\in_r$ of value 4 was applied on the metallic surface 1.

A second coat 3 of paint without microwires with a thickness of 700 µm was then applied, resulting in a real part of the dielectric constant $\in_r$ of 6.5.

A third active coat 4 was then applied on the second coat 3, the third active coat containing microwires in a density of 2% by weight, with a thickness of 300 μm, and resulting in a real part of the dielectric constant $\in_r$ of 75.

A fourth coat 5 of finish was then applied on the third active coat, this coat having a thickness of 100 μm, and a dielectric constant $\in_r$ of 6.5.

Figure 3:
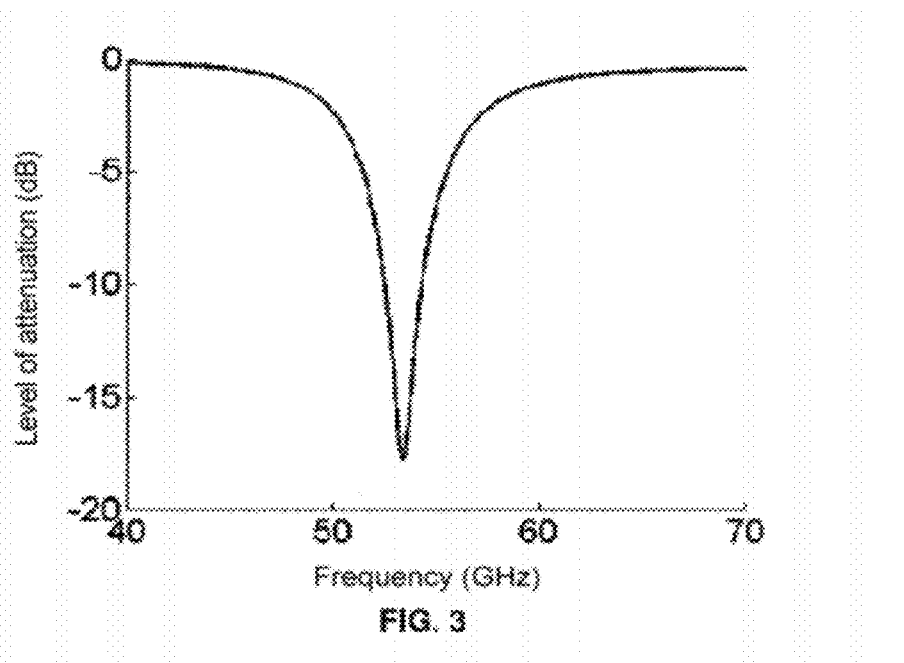
FIG. 3 shows the resulting attenuation spectrum after applying the painting process of the invention shown in FIG. 1.

The paint thus obtained has an attenuation curve of electromagnetic waves centred on 53 GHz with a level of 18 dB and with a level of attenuation greater than 10 dB for a bandwidth of 1.6 GHz centred on 53 GHz, as shown in the graph of FIG. 3.

FIG. 1 shows a sectioned view of the result of painting a metallic surface according to the process of the invention. The following can be seen in this figure:
- the metallic surface 1,
- the first coat 2 of primer,
- the second coat 3 of paint (without metallic microwires),
- the third "active" coat 4 containing metallic microwires, and
- the fourth coat 5 of finish.

In the second case, amorphous microwires with a diameter of the metallic core of 8 μm and a length of 2 mm were used. The microwires were integrated in the paint by beating paint with a real part of the dielectric constant, $\in_r$, of value 4 lowered with 10% solvent with a mixing rod at 1000 rpm.

A 900 μm first coat 2 of primer with a real part of the dielectric constant $\in_r$ of value 4 was applied on the metallic 1 surface.

A second coat 3' of paint containing microwires at a density of 4% by weight, with a thickness of 200 μm was then applied, resulting in a real part of the dielectric constant $\in_r$ of 60.

The active coat 4 is applied on the second coat 3'; this active coat contained microwires at a density of 2% by weight.

The coat 5 of finish applied on the active coat 4 had a thickness of 75 μm and a dielectric constant $\in_r$ of 4.

Figure 4:
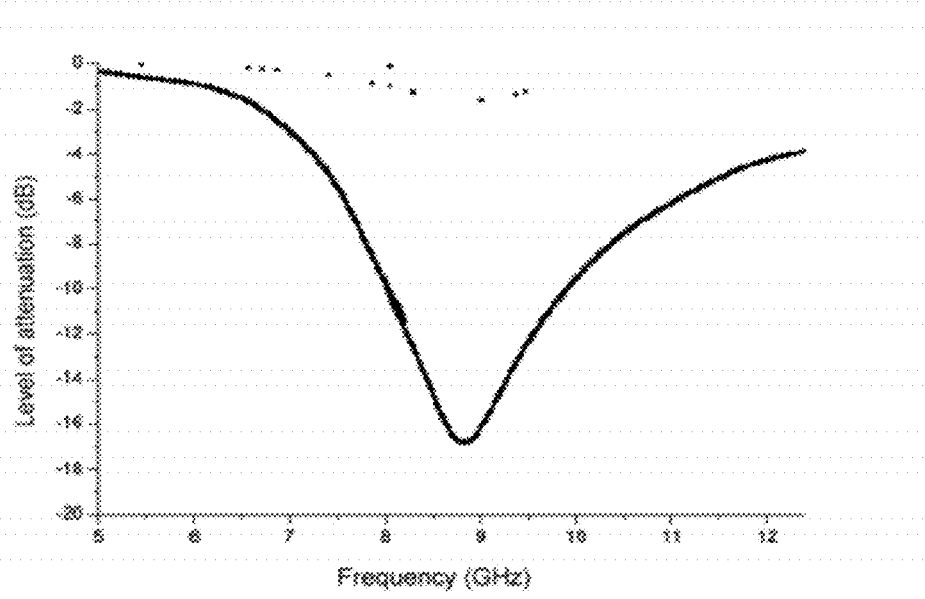
FIG. 4 shows the resulting attenuation spectrum after applying the painting process of the invention shown in FIG. 2.

In this case, the paint obtained has an attenuation curve of electromagnetic waves centred on 9 GHz with a level of 18 dB and with a level of attenuation greater than 10 dB for a bandwidth of 1 GHz centred on 9 GHz, as shown in the graph of FIG. 4.

Figure 2:
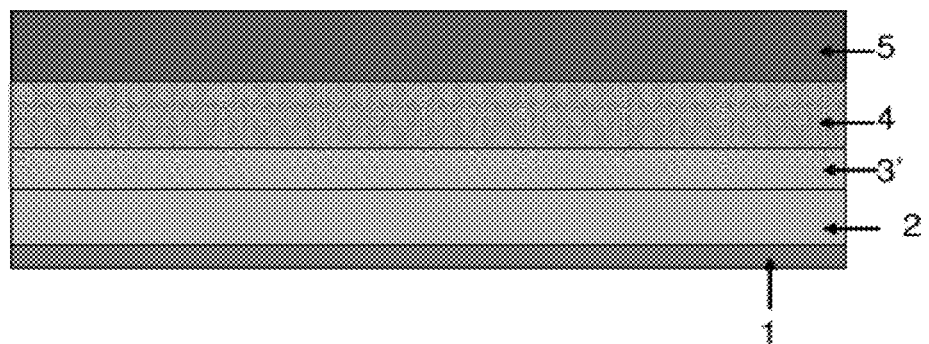

FIG. 2 shows a sectioned view of the results of painting a metallic surface according to the process of the invention. The following can be seen in this figure:
- the metallic surface 1,
- the first coat 2 of primer having greater thickness than in the case shown in FIG. 1,
- the second coat 3' of paint containing metallic microwires and having a thickness less than in the case shown in FIG. 1,
- the third "active" coat 4 containing metallic microwires, and
- the fourth coat 5 of finish.

In view of this description and set of drawings, the person skilled in the art will be able to understand that the embodiments of the invention which have been described can be combined in multiple manners within the object of the invention.

The invention claimed is:

1. A method of making an attenuating paint from an initial paint, the attenuating paint for attenuating a reflectivity of electromagnetic radiation, the method comprising the steps of:
   (a) liquefying the initial paint with a solvent to make a liquefied paint, the solvent being in an amount less than 20% of an amount of the initial paint and corresponding to a type of the initial paint, the initial paint comprising a dielectric constant $\in_r$;
   (b) adding amorphous metallic microwires to the liquefied paint in a proportion X to the liquefied paint make a mixed paint having integrated microwires, the amorphous metallic microwires having a length l and a metallic core with a core diameter $d_c$;
   (c) beating the mixed paint with a mixing rod at a speed of less than 2500 revolutions per minute to integrate the amorphous metallic microwires to make the attenuating paint;
   wherein a maximum attenuation frequency of the reflectivity of the electromagnetic radiation having a range which is determined by the length l and the core diameter $d_c$ of each of the microwires, by a proportion X of the microwires in the attenuating paint, and by the dielectric constant $\in_r$ of the initial paint.

2. The method of claim 1, wherein each of the microwires comprises the core diameter $d_c$ of less than 100 micrometers and a total diameter of less than 200 micrometers.

3. The method of claim 1, wherein each of the microwires comprises a length between 0.1 and 20 mm.

4. The method of claim 2, wherein each of the microwires comprises a length between 0.1 and 20 mm.

5. The method of claim 1, wherein the dielectric constant $\in_r$ comprises a real part of 4, length l comprises 2 mm, and the core diameter $d_c$ comprises 8 micrometers.

\* \* \* \* \*